United States Patent
You et al.

(10) Patent No.: US 8,546,803 B2
(45) Date of Patent: Oct. 1, 2013

(54) ORGANIC LIGHT-EMITTING DISPLAY AND METHOD OF MANUFACTURING THE SAME

(75) Inventors: Chun-Gi You, Asan-si (KR); Joon-Hoo Choi, Seongnam-si (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 85 days.

(21) Appl. No.: 13/160,352

(22) Filed: Jun. 14, 2011

(65) Prior Publication Data

US 2012/0175615 A1    Jul. 12, 2012

(30) Foreign Application Priority Data

Jan. 10, 2011 (KR) .................. 10-2011-0002349

(51) Int. Cl.
*H01L 29/10* (2006.01)
*H01L 21/00* (2006.01)

(52) U.S. Cl.
USPC ............. 257/57; 257/E51.006; 257/E21.413; 438/151

(58) Field of Classification Search
USPC ............................................. 257/E51.006, 57
See application file for complete search history.

(56) References Cited

U.S. PATENT DOCUMENTS

| 6,753,557 B2* | 6/2004 | Nakai ............................ 257/233 |
| 2001/0019133 A1* | 9/2001 | Konuma et al. ................. 257/79 |
| 2003/0059986 A1* | 3/2003 | Shibata .......................... 438/149 |
| 2005/0189578 A1* | 9/2005 | Seo et al. ....................... 257/306 |
| 2007/0001570 A1 | 1/2007 | Nomura et al. |
| 2010/0006826 A1* | 1/2010 | Dimmler ......................... 257/40 |

FOREIGN PATENT DOCUMENTS

| KR | 10-0560795 | 3/2006 |
| KR | 10-2007-0076860 | 7/2007 |

* cited by examiner

*Primary Examiner* — Lex Malsawma
(74) *Attorney, Agent, or Firm* — Robert E. Bushnell, Esq.

(57) ABSTRACT

In an organic light-emitting display having superior image quality and device reliability, and a related method of manufacturing the organic light-emitting display, the organic light-emitting display comprises: a gate electrode formed on a substrate; an interlayer insulating film formed on the substrate so as to cover the gate electrode; and a transparent electrode formed on the interlayer insulating film. The interlayer insulating film comprises multiple layers having different refractive indices.

25 Claims, 12 Drawing Sheets

ORGANIC LIGHT-EMITTING DISPLAY AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 10$^{th}$ of Jan. 2011 and there duly assigned Serial No. 10-2011-0002349.

BACKGROUND OF THE INVENTION

1. Field of the Invention

The present invention relates to an organic light-emitting display and a method of manufacturing the same and, more particularly, to an organic light-emitting display having superior image quality and device reliability, and a method of manufacturing the organic light-emitting display.

2. Description of the Related Art

Organic light-emitting displays are self-luminous displays which emit light by electrically exciting an organic compound. Organic light-emitting displays are drawing a lot of attention as next-generation displays because of their low driving voltages, thin design, wide viewing angles, and fast response times.

An organic light-emitting display includes an organic light-emitting layer between an anode electrode and a cathode electrode. Holes from the anode electrode combine with electrons from the cathode electrode in the organic light-emitting layer to form excitons, which are hole-electron pairs, and the organic light-emitting layer emits light using energy generated when the excitons return from an excited state to a ground state. Generally, organic light-emitting displays are classified into bottom-emission organic light-emitting displays and top-emission organic light-emitting displays according to the surface from which light is emitted. In bottom-emission organic light-emitting displays, an image is realized toward a substrate on which organic light-emitting devices are formed. In top emission organic light-emitting displays, an image is realized away from a substrate.

As panels are increasingly required to become larger and provide higher image quality, color reproducibility needs to be increased in order to reproduce colors close to the original. To improve light coupling efficiency as one way of increasing color reproducibility, various resonance structures are being employed.

When a bottom emission organic light-emitting display employs a resonance structure, a gate insulating film or a buffer layer disposed under a gate electrode may be formed as a multilayer in order to increase resonance efficiency. In this case, however, device reliability can be adversely affected.

SUMMARY OF THE INVENTION

The present invention provides an organic light-emitting display having superior image quality and device reliability.

The present invention also provides a method of manufacturing an organic light-emitting display having superior image quality and device reliability.

However, the present invention is not restricted to the specific embodiment disclosed herein. The above and other aspects of the present invention will become more apparent to one of ordinary skill in the art to which the present invention pertains by referencing the detailed description of the present invention given below.

According to an aspect of the present invention, an organic light-emitting display comprises: a gate electrode formed on a substrate; an interlayer insulating film formed on the substrate to cover the gate electrode; and a transparent electrode formed on the interlayer insulating film; wherein the interlayer insulating film consists of multiple layers having different refractive indices.

According to another aspect of the present invention, an organic light-emitting display comprises: a buffer layer formed on an entire surface of a substrate; an active layer formed on the buffer layer and including a channel region and source and drain regions; a gate insulating film formed on the active layer; a gate electrode formed on the gate insulating film to overlap the channel region; an interlayer insulating film formed on the gate insulating film to cover the gate electrode; and a transparent electrode formed on the interlayer insulating film; wherein the interlayer insulating film comprises of multiple layers having different refractive indices.

According to another aspect of the present invention, a method of manufacturing an organic light-emitting display comprises: forming an active layer which includes a channel region and source and drain regions, and a gate electrode which overlaps the channel region of the active layer, on a substrate; forming an interlayer insulating film by stacking multiple layers having different refractive indices on the gate electrode; and forming a transparent electrode by stacking a transparent conductive film on the interlayer insulating film and patterning the transparent conductive film.

According to another aspect of the present invention, a method of manufacturing an organic light-emitting display comprises: forming an active layer, which includes a channel region and source and drain regions, on a substrate; forming a gate insulating film on the substrate and the active layer; forming a gate electrode on the gate insulating film so as to overlap the channel region of the active layer; forming an interlayer insulating film on the gate electrode by stacking multiple layers having different refractive indices; forming a conductive film for forming a transparent electrode on the interlayer insulating film; forming contact holes which expose the source and drain regions by etching the interlayer insulating film and the conductive film for forming the transparent electrode; and forming the transparent electrode and source and drain electrodes by stacking a conductive film for forming the source and drain electrodes, which fill the contact holes, on the conductive film for forming the transparent electrode, and patterning the conductive film for forming the transparent electrode and the conductive film for forming the source and drain electrodes.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
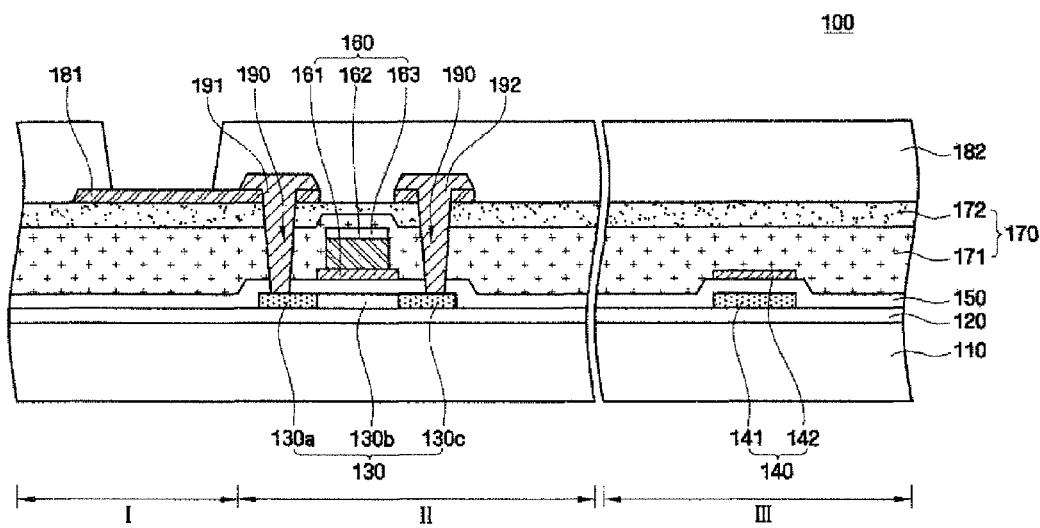
FIG. 1 is a cross-sectional view of an organic light-emitting display according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that, when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to planar and cross-section illustrations which are schematic illustrations of idealized embodiments of the invention. As such, variations from the shapes of the illustrations, as a result (for example) of manufacturing techniques and/or tolerances, are to be expected. Thus, embodiments of the invention should not be construed as being limited to the particular shapes of regions illustrated herein, but are to include deviations in shapes that result, for example, from manufacturing. Thus, the regions illustrated in the figures are schematic in nature and their shapes are not intended to illustrate the actual shape of a region of a device, and thus are not intended to limit the scope of the invention.

Hereinafter, exemplary embodiments of the present invention will be described in further detail with reference to the accompanying drawings.

An organic light-emitting display according to an exemplary embodiment of the present invention will now be described with reference to FIG. 1.

FIG. 1 is a cross-sectional view of an organic light-emitting display according to an exemplary embodiment of the present invention.

Referring to FIG. 1, the organic light-emitting display 100 according to the current exemplary embodiment includes a substrate 110, a buffer layer 120, an active layer 130, a capacitor 140, a gate insulating film 150, a gate electrode 160, an interlayer insulating film 170, a transparent electrode 181, contact holes 190, source and drain electrodes 191 and 192, respectively, and a pixel defined layer 182 formed on the substrate 110.

The substrate 110 includes a light-emitting region I, a transistor region II, and a storage region III. The light-emitting region I is a region which includes an anode electrode, a cathode electrode, and an organic light-emitting layer formed between the anode electrode and the cathode electrode so as to emit light. The transistor region II is a region on which a thin-film transistor including the active layer 130, the gate electrode 160 and the source and drain electrodes 191 and 192, respectively, is formed, and the storage region III is a region on which the capacitor 140 is formed.

The substrate 110 may be a transparent substrate made of, e.g., glass, a quartz substrate, a ceramic substrate, a silicon substrate, or a flexible substrate made of, e.g., plastic. An appropriate material may be selected for the substrate 110 according to the needs of those of ordinary skill in the art. When the organic light-emitting display 100 is a bottom emission type, the substrate 110 may be made of a transparent material.

The buffer layer 120 is formed on the entire surface of the substrate 110. The buffer layer 120 prevents the penetration of impurities (such as alkali ions) from the substrate 110 into a thin-film transistor which is to be formed in a subsequent process, and planarizes the surface of the substrate 110. The buffer layer 120 may be made of any material which allows the buffer layer 120 to perform these functions. In addition, the buffer layer 120 may be formed using a conventional method known in the art, such as chemical vapor deposition (CVD). The buffer layer 112 is not essential. Thus, the buffer layer 112 can be omitted, depending on the type and processing conditions of the substrate 110.

The active layer 130 is formed on the buffer layer 120 of the transistor region II. The active layer 130 includes a channel region 130b undoped with impurities, and source and drain regions 130a and 130c, respectively, disposed on both sides of the channel region 130b and doped with p- or n-type impurities. The impurities may vary according to the type of transistor.

The active layer 130 may be formed by injecting impurities into a semiconductor film. Specifically, the active layer 130 may be made of amorphous silicon or polycrystalline silicon. When the active layer 130 is made of polycrystalline silicon, it may have higher charge mobility than when made of amorphous silicon. Specifically, the active layer 130 made of polycrystalline silicon may be formed by depositing polycrystalline silicon directly on the buffer layer 120 or by forming an amorphous silicon layer, crystallizing the amorphous silicon layer using eximer laser annealing (ELA), sequential lateral solidification (SLS), metal induced crystallization (MIC), metal induced lateral crystallization (MILC) or super grain silicon (SGS), and patterning the crystallized amorphous silicon layer.

The gate insulating film 150 is formed on the entire surface of the substrate 110 and on the active layer 130. The gate insulating film 150 may be formed using a conventional method known in the art, such as CVD or plasma-enhanced CVD (PECVD). The gate insulating film 150 may be made of an inorganic material or a mixture of an organic material and an inorganic material. Examples of the inorganic material include $SiO_2$, $SiN_x$, and SiON.

The gate electrode 160 is formed on the gate insulating film 150 of the transistor region II and overlaps the channel region 130b of the active layer 130. The gate electrode 160 may be a single layer of a material or a mixture of materials selected from the group consisting of Mo, W, AlNd, Ti, Al, Ag, and an alloy of these materials. Alternatively, the gate electrode 160 may be made up of two or more layers of Mo, Al or Ag, which is a material with low resistivity, in order to reduce wiring resistance. That is, the gate electrode 160 may be formed by sequentially stacking multiple conductive films so as to reduce wiring resistance. Specifically, the gate electrode 160 may have a multilayered structure composed of Mo/Al/Mo, MoW/AlNd/MoW, Mo/Ag/Mo, Mo/Ag alloy/Mo, or Ti/Al/Mo. In FIG. 1, the gate electrode 160 consists of a first gate electrode film 161, a second gate electrode film 162, and a third gate electrode film 163 stacked sequentially. Specifically, the gate electrode 160 has a multilayered structure composed of Ti/Al/Mo stacked sequentially.

If the gate electrode 160 is formed by sequentially stacking multiple conductive films, a step may be formed between the lowest conductive film and the conductive films disposed on the lowest conductive film. Specifically, a step may be formed between the first gate electrode film 161 and the second and third gate electrode films 162 and 163, respectively, disposed on the first gate electrode film 161. Since the first gate electrode film 161 is wider than the second and third gate electrode films 162 and 163, respectively, a predetermined region of each end of the first gate electrode film 161 is exposed.

On the storage region III, the capacitor 140 having a capacitor first electrode 141 and a capacitor second electrode 142 is formed with the gate insulating film 150 interposed between the capacitor first electrode 141 and the capacitor second electrode 142.

Since the gate insulating film 150 is formed on the entire surface of the substrate 110 so as to extend up to the storage region III, it serves as a dielectric film of the capacitor 140 on the storage region III.

The capacitor first electrode 141 is formed on the buffer layer 120. Specifically, the capacitor first electrode 141 may be formed by the same process as the active layer 130 of the transistor region II by injecting impurities into a semiconductor film.

The capacitor second electrode 142 may be made of a single layer of a material or a mixture of materials selected from the group consisting of Mo, W, AlNd, Ti, Al, Ag, and an alloy of these materials. If the capacitor second electrode 142 is made of the same material as the gate electrode 160 or if the gate electrode 160 consists of multiple layers, the capacitor second electrode 142 may be made of the same material as the first gate electrode film 161 at the bottom. The thickness of the capacitor second electrode 142 may be adjusted appropriately by those of ordinary skill in the art so as to allow impurities to be easily injected into the capacitor first electrode 141. Specifically, the capacitor second electrode 142 may be formed so as to have a thickness equal to that of the first gate electrode film 161.

The interlayer insulating film 170 is formed to a predetermined thickness on the entire surface of the substrate 110 so as to cover the gate electrode 160 and the capacitor 140. The interlayer insulating film 170 not only insulates the gate electrode 160 from the source and drain electrodes 191 and 192, respectively, which are to be formed subsequently, but also planarizes the entire surface of the device to facilitate a subsequent process. In addition, in the current exemplary embodiment, the interlayer insulating film 170 forms a resonance structure which makes light emitted from an organic light-emitting layer (not shown) of the light-emitting region I resonate.

The interlayer insulating film 170 may consist of two or more layers having different refractive indices. In FIG. 1, the interlayer insulating film 170 is a double layer consisting of a first interlayer insulating film 171 and a second interlayer insulating film 172. The first interlayer insulating film 171 and the second interlayer insulating film 172 have different refractive indices. As shown in FIG. 1, the organic light-emitting display 100 according to the current exemplary embodiment is a bottom emission organic light-emitting display in which the transparent electrode 181 is formed on the interlayer insulating film 170. Thus, a resonance structure, in which light emitted from the organic light-emitting layer (not shown) resonates in the buffer layer 120, the gate insulating film 150 and the interlayer insulating film 170, is formed. In this regard, the interlayer insulating film 170 may be made up of multiple layers having various thicknesses such that light near a desired wavelength can be selectively and intensively emitted through the resonance structure. The multilayered interlayer insulating film 170 improves light efficiency of the organic light-emitting display 100 and ensures superior color reproducibility, thereby enhancing image quality.

The interlayer insulating film 170 may be made of an organic insulating film or an inorganic insulating film. To form the resonance structure, the interlayer insulating film 170 may be made of an inorganic insulating film or a composite of an inorganic insulating film and an organic insulating film. Examples of the inorganic insulating film include $SiO_2$, $SiN_X$, SiON, $Al_2O_3$, $TiO_2$, $Ta_2O_5$, $HfO_2$, $ZrO_2$, BST and PZT, and examples of the organic insulating film include general-purpose polymer (such as polymethylmethacrylate (PMMA) or polystyrene (PS)), polymer derivatives having a phenol group, acrylic polymer, imide polymer, aryl ether polymer, amide polymer, fluorine polymer, p-xylene polymer, vinyl alcohol polymer, and a blend of these materials.

The transparent electrode 181 is formed on the interlayer insulating film 170 of the light-emitting region I and the transistor region II. In the organic light-emitting display 100 according to the current exemplary embodiment, an electrode layer under the organic light-emitting layer (not shown) is formed in the transparent electrode 181. Therefore, the organic light-emitting display 100 according to the current exemplary embodiment has a bottom emission structure. In this structure, a resonance structure, in which light resonates in an inorganic or organic film between the transparent electrode 181 and the substrate 110, can be formed. In the present invention, since the transparent electrode 181 is formed on the interlayer insulating film 170, not only the buffer layer 120 and the gate insulating film 150, but also the interlayer insulating film 170, function as reflective layers of the resonance structure. However, if the transparent electrode 181 is formed under the interlayer insulating film 170, the resonance structure is formed by the buffer layer 120 or the gate insulating film 150, and the interlayer insulating film 170 is not included in the resonance structure. In this regard, if the buffer layer 120 or the gate insulating film 150 is formed as a thin multilayer in order to increase resonance efficiency, it may affect device characteristics, thus deteriorating device reliability. On the other hand, if the interlayer insulating film 170 forms the resonance structure as in the current exemplary embodiment, the resonance efficiency is increased, while the device reliability is not affected. Furthermore, the increased resonance efficiency improves color reproducibility, resulting in superior image quality.

The transparent electrode 181 is formed on the interlayer insulating film 170, specifically, on the interlayer insulating film 170 so as to be in direct contact with the interlayer insulating film 170. The transparent electrode 181 may be made of, but is not limited to, a material or a mixture of materials selected from the group consisting of indium tin oxide (ITO), indium zinc oxide (IZO), zinc oxide (ZnO), and indium oxide ($In_2O_3$).

When the transparent electrode 181 is made of a material (such as ITO) having a high work function, it may serve as an anode electrode which is a hole injection electrode, and the organic light-emitting layer (not shown) and a cathode electrode (not shown), which is an electron injection electrode, may be formed on an exposed portion of the transparent electrode 181. However, this is a relative concept. That is, the transparent electrode 181 may also be the cathode electrode, and the anode electrode may be formed on the organic light-emitting layer. In this structure, holes and electrons are injected into the organic light-emitting layer, and the injected holes and electrons combine to form excitons. The excitons emit light when they fall from an excited state to a ground state.

The contact holes 190 penetrate the transparent electrode 181, the interlayer insulating film 170, and the gate insulating film 150. The contact holes 190 expose predetermined regions of the source and drain regions 130$a$ and 130$c$, respectively, of the active layer 130.

The source and drain electrodes 191 and 192, respectively, are formed on the transistor region II and on the transparent electrode 181. Any one of the source and drain electrodes 191 and 192, respectively, is formed on the transparent electrode 181 of the light-emitting region I so as to be in direct contact with the transparent electrode 181, and thus electrically connected to the transparent electrode 181. The other one of the source and drain electrodes 191 and 192, respectively, is formed on a conductive film for the transparent electrode 181. The source and drain electrodes 191 and 192, respectively, are electrically connected to the source and drain regions 130$a$ and 130$c$, respectively, of the active layer 130 through the contact hole 190.

The source and drain electrodes 191 and 192, respectively, may be a single layer of a material or a mixture of materials selected from the group consisting of Mo, W, MoW, AlNd, Ti, Al, Ag, and an alloy of these materials. Alternatively, the source and drain electrodes 191 and 192, respectively, may be made up of two or more layers of Mo, Al or Ag, which is a material with low resistivity, in order to reduce wiring resistance. That is, the source and drain electrodes 191 and 192, respectively, may be formed by sequentially stacking multiple conductive films so as to reduce wiring resistance. Specifically, the source and drain electrodes 191 and 192, respectively, may have a multilayered structure composed of Mo/Al/Mo, MoW/AlNd/MoW, Mo/Ag/Mo, Mo/Ag alloy/Mo, or Ti/Al/Mo. In FIG. 1, the source and drain electrodes 191 and 192, respectively, are formed as a single layer.

The pixel defined layer 182 is formed on the interlayer insulating film 170 of the light-emitting region I, the transistor region II and the storage region III, and exposes a predetermined region of the transparent electrode 181 of the light-emitting region I.

The pixel defined layer 182 may be made of a material or a mixture of materials selected from the group consisting of polyacrylic resin, epoxy rein, phenol resin, polyamide resin, polyimide resin, unsaturated polyester resin, polyphenylene resin, polyphenylene sulfide resin, and benzocyclobutene.

Hereinafter, an organic light-emitting display according to another exemplary embodiment of the present invention will be described with reference to FIG. 2.

Figure 2:
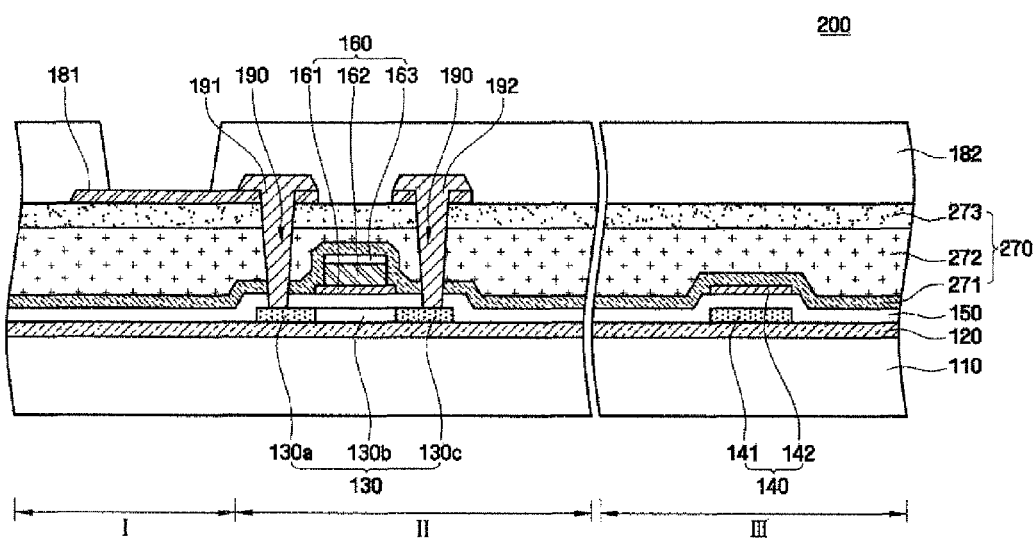
FIG. 2 is a cross-sectional view of an organic light-emitting display according to another exemplary embodiment of the present invention.

FIG. 2 is a cross-sectional view of an organic light-emitting display according to another exemplary embodiment of the present invention.

Referring to FIG. 2, the organic light-emitting display 200 according to the current exemplary embodiment includes a buffer layer 120, an active layer 130, a capacitor 140, a gate insulating film 150, a gate electrode 160, an interlayer insulating film 270, a transparent electrode 181, contact holes 190, source and drain electrodes 191 and 192, respectively, and a pixel defined layer 182 formed on a substrate 110 which includes a light-emitting region I, a transistor region II, and a storage region III. The organic light-emitting display 200 according to the current exemplary embodiment has the same configuration as the organic light-emitting display 100 of FIG. 1, except for the interlayer insulating film 270. Therefore, the following description will focus on the interlayer insulating film 270, and elements substantially identical to those of the previous embodiment are indicated by like reference numerals, and thus a detailed description thereof will be omitted.

The interlayer insulating film 270 may be formed as a triple layer consisting of a first interlayer insulating film 271, a second interlayer insulating film 272, and a third interlayer insulating film 273 stacked sequentially. In this regard, the first interlayer insulating film 271, the second interlayer insulating film 272, and the third interlayer insulating film 273 may have different refractive indices and have equal or different thicknesses. In FIG. 2, the first interlayer insulating film 271 is formed relatively thin and covers a gate electrode 160, the second interlayer insulating film 272 is formed on the first interlayer insulating film 272 so as to have a flat top surface, and the third interlayer insulating film 273 is formed on the second interlayer insulating film 272 so as to have a flat top surface. However, the present invention is not limited to this structure. The interlayer insulating film 270 may also be made up of three or more layers. In addition, the number of layers which constitute the interlayer insulating film 270 and the thickness of each layer of the interlayer insulating film 270 may be appropriately determined by those of ordinary skill in the art, so that light close to a desired wavelength can be extracted as much as possible.

The first interlayer insulating film 271, the second interlayer insulating film 272, and the third interlayer insulating film 273 may be made of an inorganic material, such as $SiO_2$, $SiN_x$, $SiN_xO_y$, or a mixture of an organic material and an inorganic material. The first interlayer insulating film 271, the second interlayer insulating film 272, and the third interlayer insulating film 273 may be made of the same or different materials. However, successive films may not be made of the same material. When the successive films are made of the same material, their thicknesses may be adjusted such that they have different refractive indices.

Hereinafter, an organic light-emitting display according to another exemplary embodiment of the present invention will be described with reference to FIG. 3.

Figure 3:
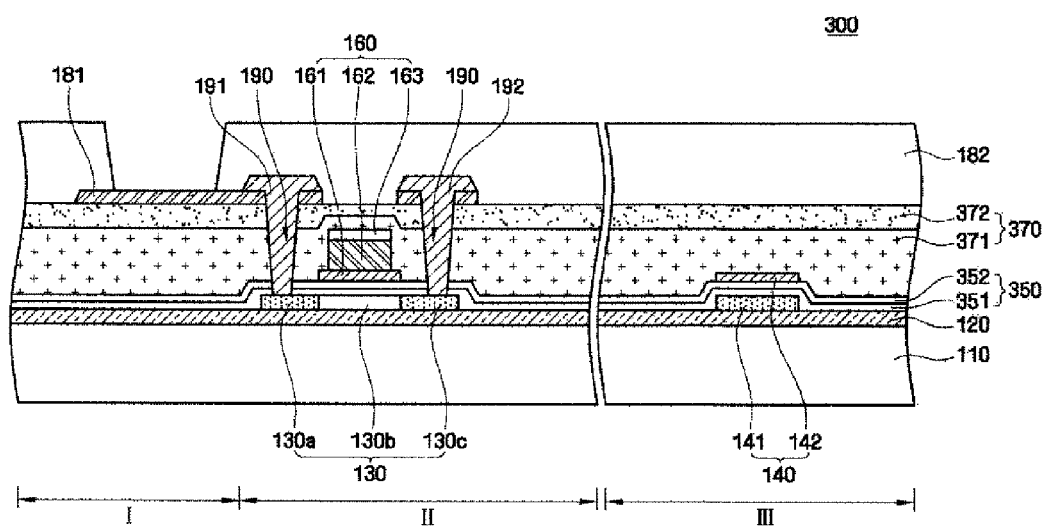
FIG. 3 is a cross-sectional view of an organic light-emitting display according to another exemplary embodiment of the present invention.

FIG. 3 is a cross-sectional view of an organic light-emitting display according to another exemplary embodiment of the present invention.

Referring to FIG. 3, the organic light-emitting display 300 according to the current exemplary embodiment includes a buffer layer 120, an active layer 130, a capacitor 140, a gate insulating film 350, a gate electrode 160, an interlayer insulating film 170, a transparent electrode 181, contact holes 190, source and drain electrodes 191 and 192, respectively, and a pixel defined layer 182 formed on a substrate 110 which includes a light-emitting region I, a transistor region II, and a storage region III. The organic light-emitting display 300 according to the current exemplary embodiment has the same configuration as the organic light-emitting display 100 of FIG. 1, except for the gate insulating film 350. Therefore, the following description will focus on the gate insulating film 350, and elements substantially identical to those of the previous embodiment are indicated by like reference numerals, and thus a detailed description thereof will be omitted.

The gate insulating film 350 is formed on the entire surface of the substrate 110 so as to cover the active layer 130, and consists of a plurality of insulating films having different refractive indices.

The gate insulating film 350 shown in FIG. 3 is a double layer consisting of a first gate insulating film 351 and a second gate insulating film 352 stacked sequentially. However, the present invention is not limited thereto, and the gate insulating film 350 may consist of two or more insulating films stacked sequentially.

Thicknesses of the first gate insulating film 351 and the second gate insulating film 352 may be arbitrarily adjusted by those of ordinary skill in the art, in view of the refractive indices of the first gate insulating film 351 and the second gate insulating film 352. Therefore, the thicknesses of the first gate insulating film 351 and the second gate insulating film 352 may be equal or different. The first gate insulating film 351 and the second gate insulating film 352 may be made of organic or inorganic insulating films having different refractive indices. That is, a structure having two or more layers, as well as the thickness and material suitable for effectively extracting light close to a desired wavelength range, may be selected for the gate insulating film 350.

Hereinafter, an organic light-emitting display according to another exemplary embodiment of the present invention will be described with reference to FIG. 4.

Figure 4:
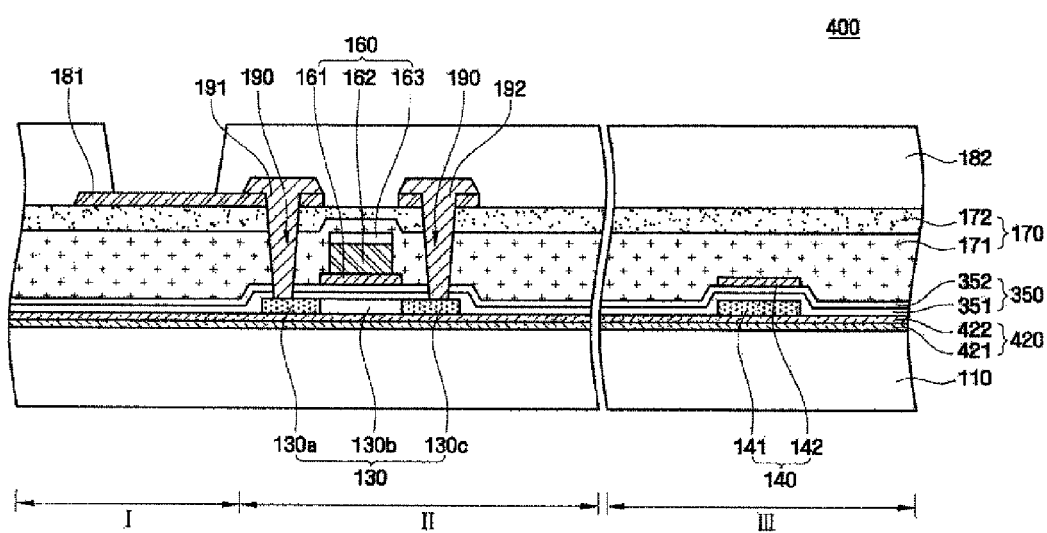
FIG. 4 is a cross-sectional view of an organic light-emitting display according to another exemplary embodiment of the present invention.

FIG. 4 is a cross-sectional view of an organic light-emitting display according to another exemplary embodiment of the present invention.

Referring to FIG. 4, the organic light-emitting display 400 according to the current exemplary embodiment includes a buffer layer 420, an active layer 130, a capacitor 140, a gate insulating film 350, a gate electrode 160, an interlayer insulating film 170, a transparent electrode 181, contact holes 190, source and drain electrodes 191 and 192, respectively, and a pixel defined layer 182 formed on a substrate 110 which includes a light-emitting region I, a transistor region II, and a storage region III. The organic light-emitting display 400 according to the current exemplary embodiment has the same configuration as the organic light-emitting display 300 of FIG. 3, except for the buffer layer 420. Therefore, the following description will focus on the buffer layer 420, and elements substantially identical to those of the previous embodiment are indicated by like reference numerals, and thus a detailed description thereof will be omitted.

The buffer layer 420 is formed on the entire surface of the substrate 110 and may consist of multiple layers having different refractive indices. The buffer layer 420 shown in FIG. 4 is a double layer consisting of a first buffer layer 421 and a second buffer layer 422. However, the present invention is not limited thereto, and the buffer layer 420 may consist of two or more layers. The buffer layer 420 may be made of an inorganic material or an organic material. The buffer layer 420 may be made of a silicon oxide layer or a silicon nitride layer.

The first buffer layer 421 and the second buffer layer 422 have different refractive indices. Thicknesses of the first buffer layer 421 and the second buffer layer 422 can be arbitrarily adjusted by those of ordinary skill in the art to be equal or different.

In the current exemplary embodiment, the buffer layer 420 functions as a reflective layer which makes light resonate. The buffer layer 420 can increase resonance efficiency since it is made up of multiple layers having different refractive indices.

As described above, in an organic light-emitting display according to the present invention, a transparent electrode is formed on an interlayer insulating film, and light emitted from an organic light-emitting layer passes through the transparent electrode. In addition, a buffer layer, a gate insulating film and the interlayer insulating film function as reflective layers and form a resonance structure. In this regard, the interlayer insulating film is made up of multiple layers having different refractive indices such that light close to a desired wavelength can be extracted. The multilayered interlayer insulating film increases resonance efficiency without affecting device characteristics. Also, the increased resonance efficiency improves color reproducibility, resulting in superior image quality. The resonance efficiency can be further increased by forming not only the interlayer insulating film but also the buffer layer and/or the gate insulating film so as to have a multilayered structure.

Hereinafter, a method of manufacturing an organic light-emitting display according to an exemplary embodiment of the present invention will be described with reference to FIGS. 1 and 5 thru 26.

FIGS. 5 thru 26 are cross-sectional views sequentially illustrating processes of a method of manufacturing an organic light-emitting display according to an exemplary embodiment of the present invention. Elements substantially identical to those of FIG. 1 are indicated by like reference numerals, and thus a detailed description thereof will be omitted.

Figure 5:
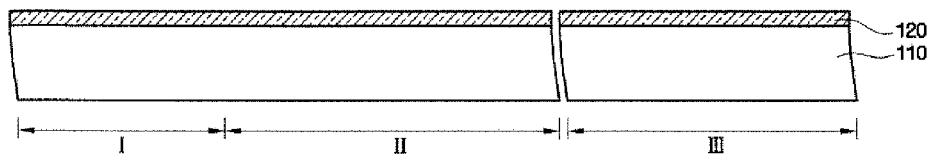
FIGS. 5 thru 26 are cross-sectional views sequentially illustrating processes of a method of manufacturing an organic light-emitting display according to an exemplary embodiment of the present invention.

Referring to FIG. 5, a buffer layer 120 is formed on a substrate 110.

The buffer layer 120 may be formed by CVD or PECVD. The buffer layer 120 may be made of an inorganic film or a composite of an inorganic film and an organic film.

Figure 6:
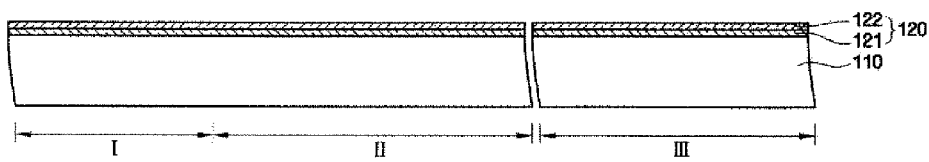

Referring to FIG. 6, the buffer layer 120 may also be formed as a double layer consisting of a first buffer layer 121 and a second buffer layer 122 stacked sequentially. While the buffer layer 120 shown in FIG. 6 is a double layer, the present invention is not limited thereto. The buffer layer 120 may also be made up of two or more layers. In this regard, the first buffer layer 121 and the second buffer layer 122 have different refractive indices. Thicknesses of the first buffer layer 121 and the second buffer layer 122 may be arbitrarily adjusted to be equal or different based on the refractive indices thereof.

Figure 7:
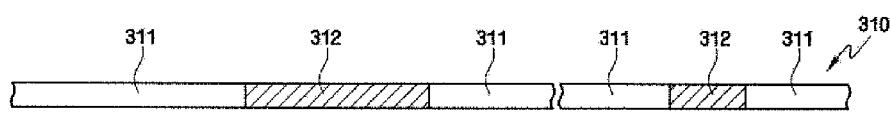
Figure 7:
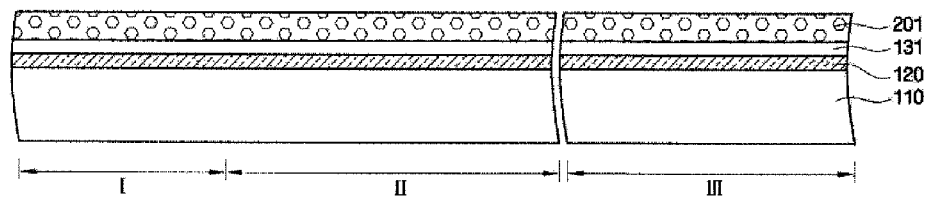
Figure 8:
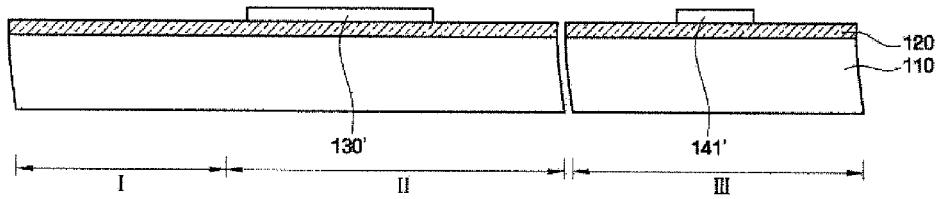

Referring to FIGS. 7 and 8, a semiconductor film 131 for forming an active layer 130 (see FIG. 1) and a capacitor first electrode 141 (see FIG. 1) is formed on the buffer layer 120, and is then patterned to form a preliminary active layer 130' and a preliminary capacitor first electrode 141'.

Specifically, the semiconductor film 131 is stacked on the buffer layer 120 by, e.g., CVD, and then a first photosensitive film 201 is formed on the semiconductor film 131. When the semiconductor film 131 is made of polycrystalline silicon, it may be formed by depositing polycrystalline silicon directly on the buffer layer 120 or by forming an amorphous silicon layer and crystallizing the amorphous silicon layer using ELA, SLS, MIC, MILC or SGS. A first photomask 310 is placed above the first photosensitive film 201. For ease of description, a case where the first photosensitive film 201 is a positive photosensitive film is described as an example. However, the present invention is not limited to this example, and a negative photosensitive film may also be used as the first photosensitive film 201.

The first photomask 310 includes light-transmitting regions 311 and light-blocking regions 312. The light-transmitting regions 311 allow emitted light to pass therethrough, and the light-blocking regions 312 block the emitted light. The first photomask 310 is positioned so that the light-blocking regions 312 correspond to regions in which the active layer 130 (see FIG. 1) and the capacitor first electrode 141 (see FIG. 1) are to be formed, respectively. Next, the first photosensitive film 201 is exposed to light through the first photomask 310, and is then developed. As a result, regions of the first photosensitive film 201 which correspond to the light-transmitting regions 311 are removed, whereas regions of the first photosensitive film 201 which correspond to the light-blocking regions 312 remain so as to form a first photosensitive film pattern.

Referring to FIG. 8, the semiconductor film 131 is etched using the first photosensitive film pattern as an etch mask, thereby forming the preliminary active layer 130' and the preliminary capacitor first electrode 141'. Then, the first photosensitive film pattern is removed.

Figure 9:
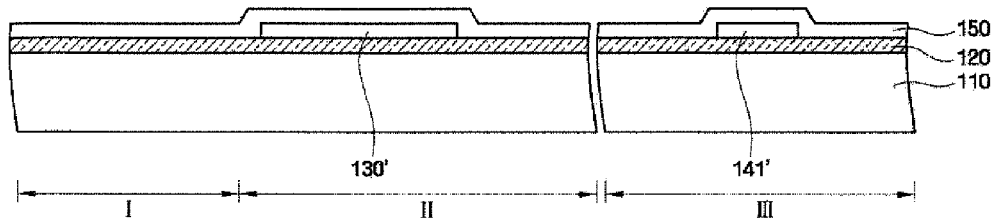

Referring to FIG. 9, a gate insulating film 150 is formed on the buffer layer 120, the preliminary active layer 130', and the preliminary capacitor first electrode 141'. The gate insulating film 150 may be formed of an organic insulating film or an inorganic insulating film, such as $SiN_x$, $SiO_2$ or SiON, by CVD. The gate insulating film 150 is preferably formed of an inorganic insulating film or a composite of an inorganic insulating film and an organic insulating film.

Figure 10:
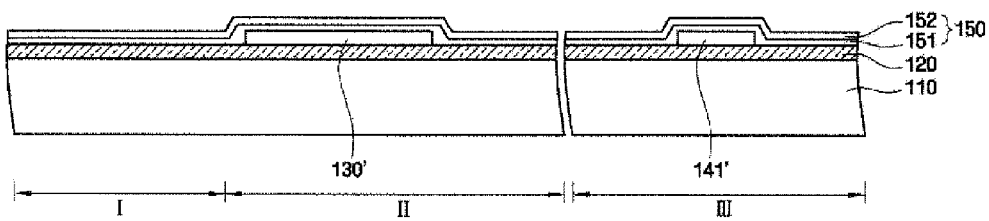

Referring to FIG. 10, the gate insulating film 150 may also be formed as a double layer consisting of a first gate insulating film 151 and a second gate insulating film 152. The gate insulating film 150 shown in FIG. 10 is a double layer consisting of the first gate insulating film 151 and the second gate insulating film 152 formed on the first gate insulating film 151. However, the present invention is not limited thereto, and the gate insulating film 150 may be made up of two or more layers. Here, the first gate insulating film 151 and the second gate insulating film 152 may be made of materials having different refractive indices, and may have equal or different thicknesses.

Referring to FIGS. 11 thru 14, a conductive film for forming a gate electrode 160 (see FIG. 1) and a capacitor second electrode 142 (see FIG. 1) is sequentially stacked on the gate insulating film 150, and is then patterned to form the gate electrode 160 and the capacitor second electrode 142.

Figure 11:
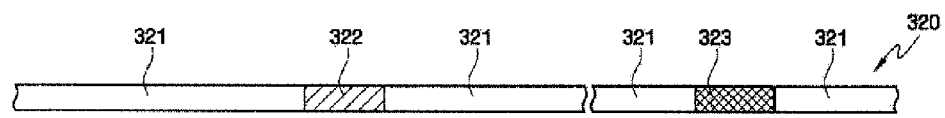
Figure 11:
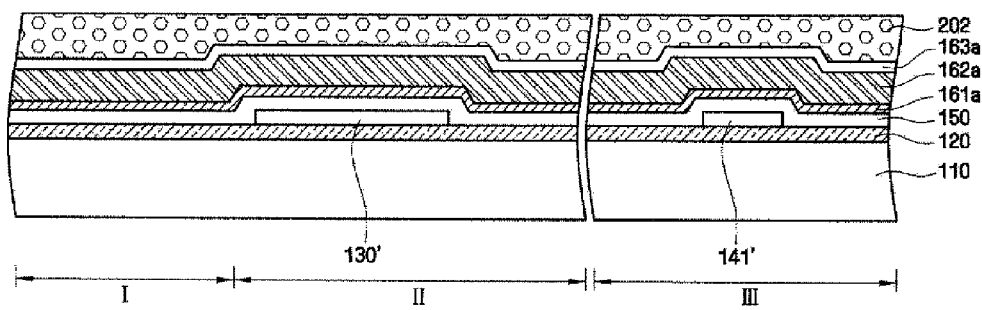

Referring to FIG. 11, a first conductive film 161a, a second conductive film 162a, and a third conductive film 163a are sequentially stacked on the gate insulating film 150 by, e.g., sputtering. Specifically, the first conductive film 161a may be made of Ti, Ta or Cr, and the second conductive film 162a may be made of Al-based metal such as Al or an Al alloy, Ag-based metal such as Ag or an Ag alloy, or Cu-based metal such as Cu or a Cu alloy. In addition, the third conductive film 163a may be made of Mo-based metal, such as Mo or a Mo alloy.

Next, a second photosensitive film 202 is formed on the third conductive film 163a, and a second photomask 320 is placed above the second photosensitive film 202. For ease of description, a case where the second photosensitive film 202 is a positive photosensitive film is described as an example. However, the present invention is not limited to this example, and a negative photosensitive film may also be used as the second photosensitive film 202.

The second photomask 320, which is a halftone mask, includes light-transmitting regions 321, a light-blocking region 322, and a semi-transmitting region 323. The semi-transmitting region 323 allows only part of emitted light to pass therethrough. The second photomask 320 is positioned such that the light-blocking region 322 corresponds to a region in which the gate electrode 160 (see FIG. 1) is to be formed, and the semi-transmitting region 323 corresponds to a region in which the capacitor second electrode 142 (see FIG. 1) is to be formed.

Figure 12:
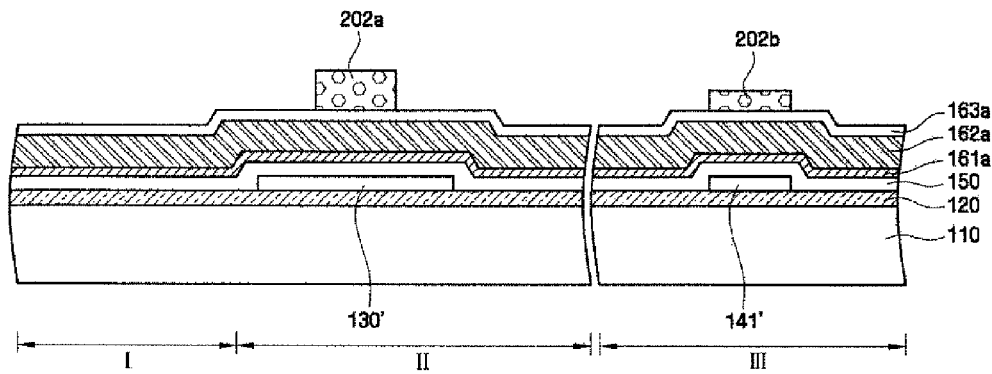

Referring to FIG. 12, the second photosensitive film 202 is exposed to light through the second photomask 320, and is then developed. As a result, regions of the second photosensitive film 202 which correspond to the light-transmitting regions 321 are removed, whereas regions of the second photosensitive film 202 which correspond to the light-blocking region 322 and the semi-transmitting region 321 remain, so as to form a second photosensitive film pattern. The second photosensitive film pattern includes a first sub photosensitive film pattern 202a corresponding to the light-blocking region 322 and a second sub photosensitive film pattern 202b corresponding to the semi-transmitting region 323. The second sub photosensitive film pattern 202b is thinner than the first sub photosensitive film pattern 202a.

Figure 13:
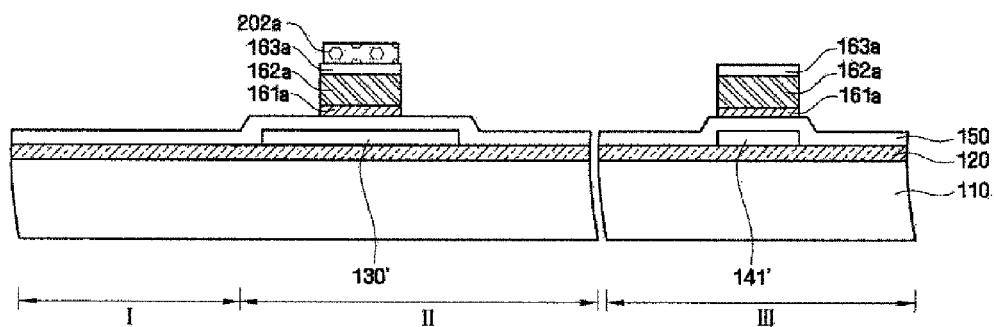

Referring to FIG. 13, the first conductive film 161a, the second conductive film 162a, and the third conductive film 163a are etched using the first sub photosensitive film pattern 202a and the second sub photosensitive film pattern 202b as etch masks. Then, the second sub photosensitive film pattern 202b is removed. In the above etching process, the second conductive film 162a and the third conductive film 163 a may be wet-etched, and then the first conductive film 161a may be dry-etched. In the wet-etching process, an etchant, such as phosphoric acid, nitric acid or acetic acid, may be used. In the dry-etching process, a Cl-based etching gas, such as $Cl_2$ or $BCl_3$, may be used. The second sub photosensitive film pattern 202b may be removed by an ashing process using oxygen. However, the present invention is not limited to the ashing process. When the second sub photosensitive film pattern 202b is removed, the first sub photosensitive film pattern 202a may also be partially removed. As a result, the thickness and width of the first sub photosensitive film pattern 202a may be reduced.

Figure 14:
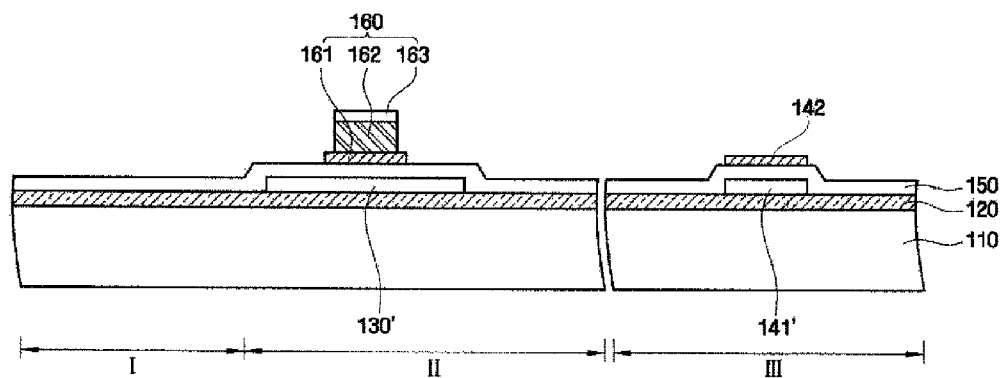

Referring to FIGS. 13 and 14, the second conductive film 162a and the third conductive film 163a are etched again using the remaining first sub photosensitive film pattern 202a as an etch mask. Then, the remaining first sub photosensitive film pattern 202a is removed. In this regard, the second conductive film 162a and the third conductive film 163a may be wet-etched, and the first sub photosensitive film pattern 202a may be removed by an ashing process. After these processes, the second conductive film 162a and the third conductive film 163a are removed from a storage region III, and only the first conductive film 161a remains in the storage region III so as to form the capacitor second electrode 142. The first conductive film 161a, the second conductive film 162a and the third conductive film 163a remaining on a transistor region II are formed into a first gate electrode film 161, a second gate electrode film 162, and a third gate electrode film 163, respectively, which constitute the triple-layered gate electrode 160. In the above etching process, since the second conductive film 162a and the third conductive film 163a are etched using the first sub photosensitive film pattern 202a with a reduced width as an etch mask, the second gate electrode film 162 and the third gate electrode film 163 may be narrower than the first gate electrode film 161. That is, a predetermined region of each end of the first gate electrode film 161 may be exposed.

In addition, since the first conductive film 161a is formed into the first gate electrode film 161 and the capacitor second electrode 142, the thickness of the capacitor second electrode 142 may be equal to that of the first gate electrode film 161.

Figure 15:
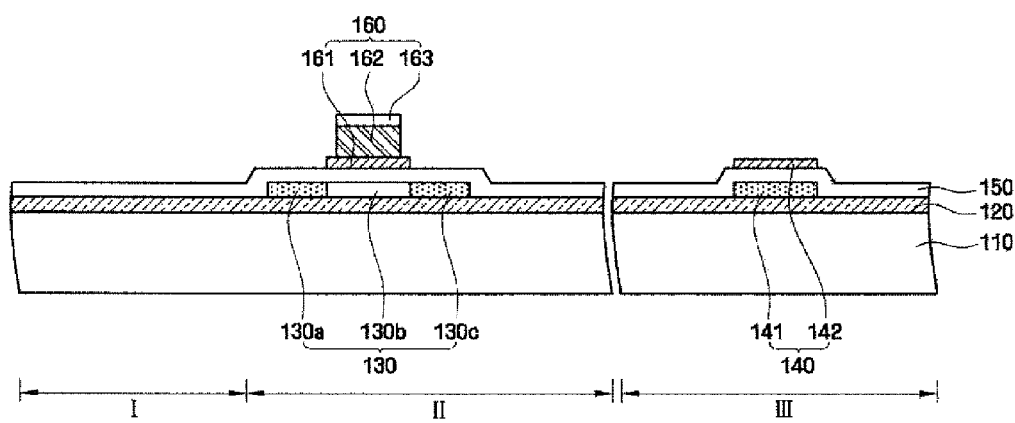

Referring to FIG. 15, N- or P-type impurities are injected using the gate electrode 160 as a mask, thereby forming the active layer 130 and the capacitor first electrode 141.

Specifically, a blocking film (not shown) having an exposed region corresponding to the active layer 130 and an exposed region corresponding to the capacitor first electrode 141 is formed on the substrate 110, and impurities are injected using the gate electrode 160 as a mask. The blocking film may be made of, but is not limited to, a photosensitive material, such as $SiO_2$ or $Si_3N_4$.

Donor impurity ions, such as P, As, or Sb, may be injected so as to manufacture an N-type thin-film transistor, and acceptor impurity ions, such as B, Al, Ga or In, may be injected so as to manufacture a P-type thin-film transistor. In this regard, since the capacitor second electrode 142 is exposed, impurities injected into the capacitor first electrode 141 may also be injected into the capacitor second electrode 142. Through this process, the capacitor first electrode 141 and the active layer 130, including a channel region 130b which is overlapped by the gate electrode 160 and is undoped with impurities, and source and drain regions 130a and 130c, respectively, which are disposed on both sides of the channel region 130b, are formed.

Figure 16:
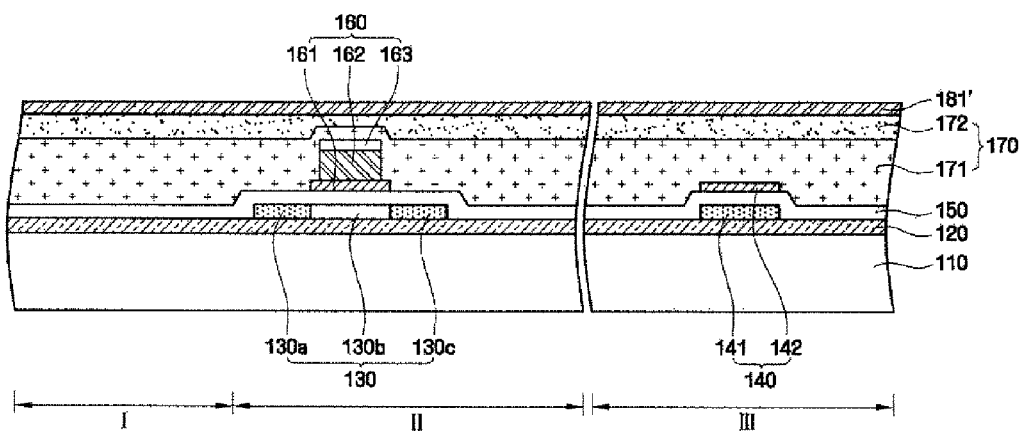

Referring to FIG. 16, an interlayer insulating film 170 and a conductive film 181' for a transparent electrode 181 are formed on the gate insulating film 150, the gate electrode 160, and the capacitor second electrode 142.

The interlayer insulating film 170 may consist of multiple layers having different refractive indices. The interlayer insulating film 170 shown in FIG. 16 is a double layer consisting of a first interlayer insulating film 171 and a second interlayer insulating film 172. However, the present invention is not limited thereto, and the interlayer insulating film 170 may be made up of two or more films according to the needs of those of ordinary skill in the art. The thickness of each layer of the multilayered interlayer insulating film 170 is not limited, and can vary according to the needs of those of ordinary skill in the art. The second interlayer insulating film 172 at the top may be formed so as to have a flat top surface. The interlayer insulating film 170 may be made of an inorganic insulating film or an organic insulating film. The interlayer insulating film 170 is preferably made of an inorganic insulating film or a composite of an inorganic insulating film and an organic insulating film.

The conductive film 181' for forming the transparent electrode 181 is formed directly on the interlayer insulating film 170, and may be a transparent conductive film containing one or more transparent materials selected from ITO, IZO, ZnO, and $In_2O_3$.

Figure 17:
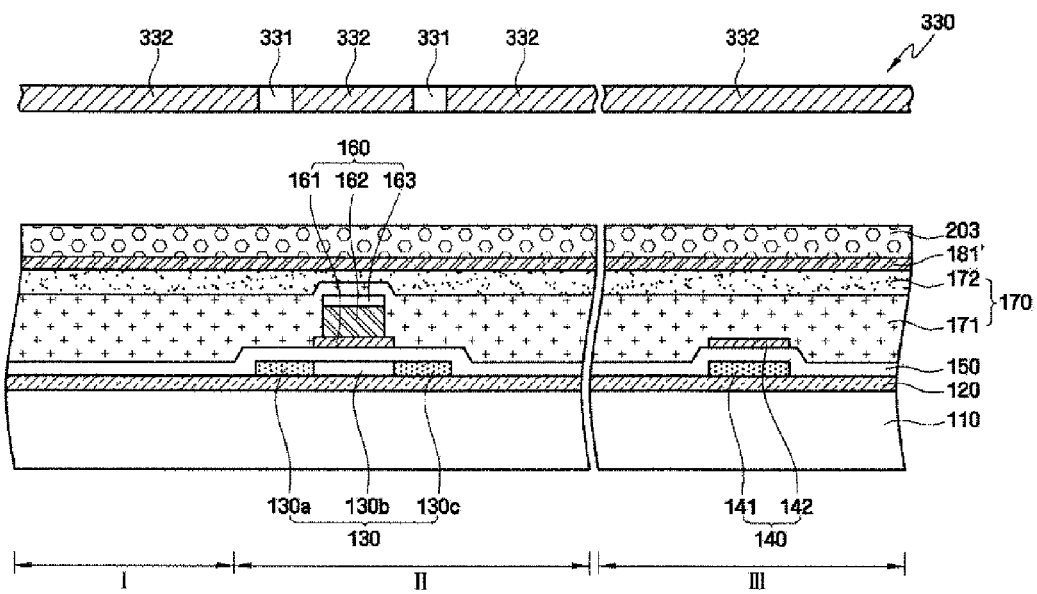
Figure 18:
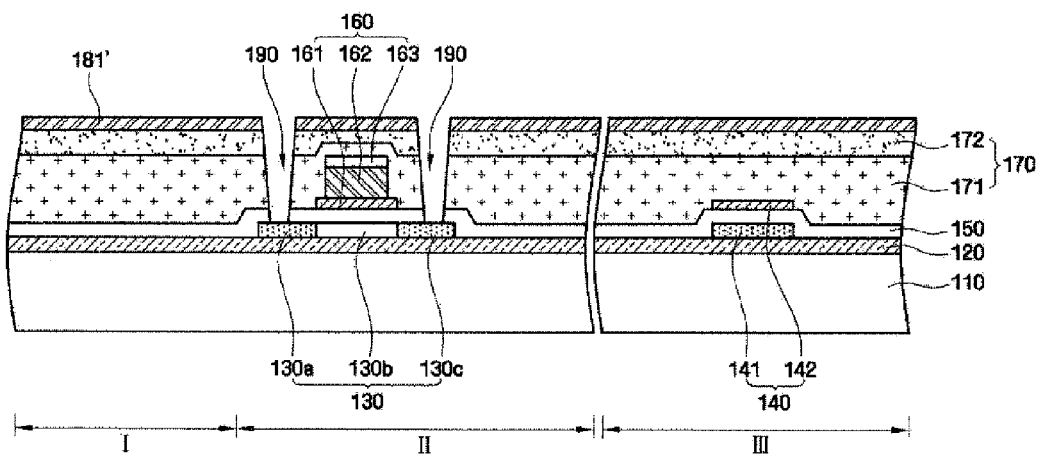

Referring to FIGS. 17 and 18, the conductive film 181' for the transparent electrode 181, the interlayer insulating film 170 and the gate insulating film 150 are etched so as to form contact holes 190 which expose predetermine regions of the source and drain regions 130a and 130c, respectively.

Referring to FIG. 17, a third photosensitive film 203 is formed on the conductive film 181' for the transparent electrode 181. Then, a third photomask 330 is placed above the third photosensitive film 203. For ease of description, the case where the third photosensitive film 203 is a positive photosensitive film is described as an example. However, the present invention is not limited to this example, and a negative photosensitive film may also be used as the third photosensitive film 203.

The third photomask 330 includes light-transmitting regions 331 and light-blocking regions 332, and is positioned so that the light-transmitting regions 331 correspond to regions in which the contact holes 190 (see FIG. 1) are to be formed.

Referring to FIGS. 17 and 18, the third photosensitive film 203 is exposed to light through the third photomask 330, and are then developed. As a result, regions of the third photosensitive film 203 which correspond to the light-transmitting regions 331 are removed, whereas regions of the third photosensitive film 203 which correspond to the light-blocking regions 332 remain, so as to form a third photosensitive film pattern. The conductive film 181' for the transparent electrode 181, the interlayer insulating film 170, and the gate insulating film 150 are etched using the third photosensitive film pattern as an etch mask, thereby forming the contact holes 190 which expose the predetermined regions of the source and drain electrodes 130a and 130c, respectively. Then, the third photosensitive film pattern is removed. The conductive film 181' for the transparent electrode 181, the interlayer insulating film 170 and the gate insulating film 150 may be dry-etched.

Referring to FIGS. 19 thru 23, a conductive film 191' for source and drain electrodes 191 and 192, respectively, is formed on the conductive film 181' for the transparent electrode 180 and is then patterned to form the transparent electrode 181 and the source and drain electrodes 191 and 192, respectively.

Figure 19:
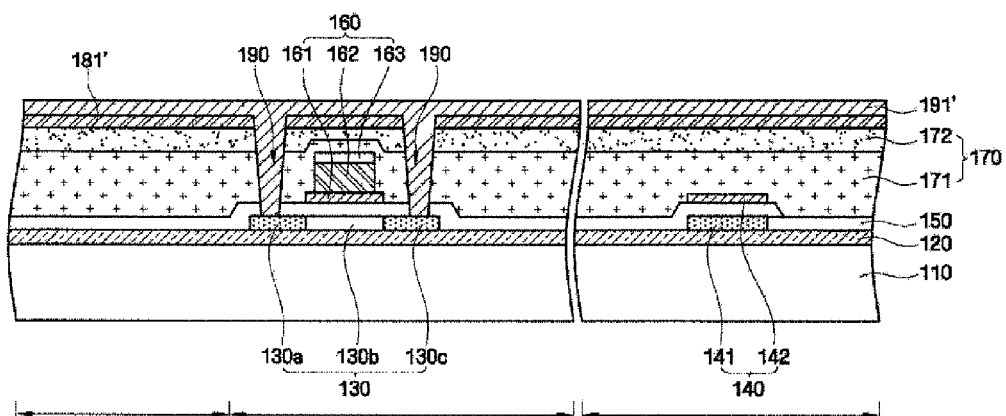
Figure 20:
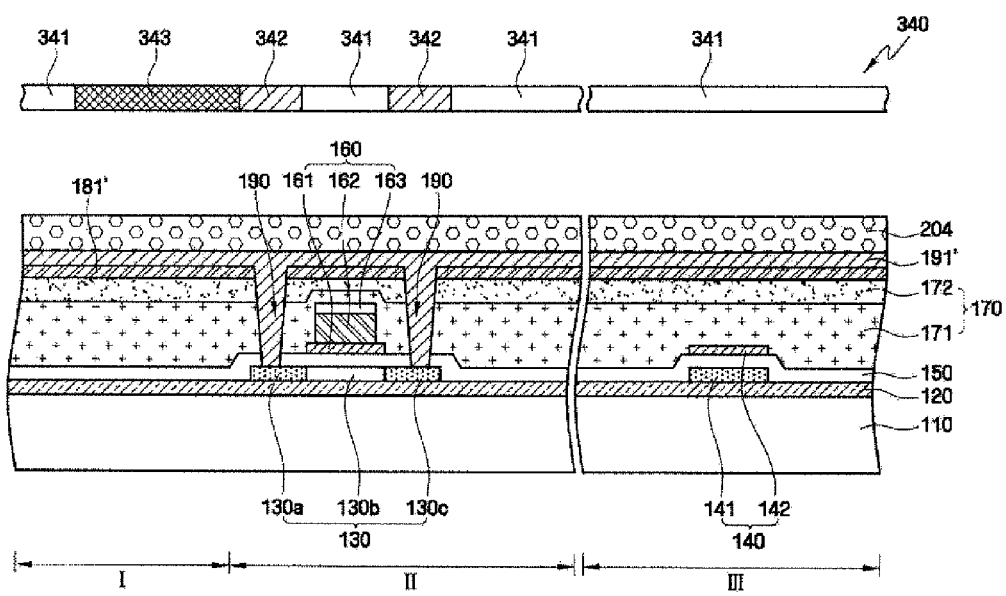

Referring to FIGS. 19 and 20, the conductive film 191' for the source and drain electrodes 191 and 192, respectively, is formed on the conductive film 181' for the transparent electrode 181 by, e.g., sputtering, and a fourth photosensitive film 204 is formed on the conductive film 191' for the source and drain electrodes 191 and 192, respectively.

A fourth photomask 340 is placed above the fourth photosensitive film 204. For ease of description, the case where the fourth photosensitive film 204 is a positive photosensitive film is described as an example. However, the present invention is not limited to this example, and a negative photosensitive film may also be used as the fourth photosensitive film 204.

The fourth photomask 340, which is a halftone mask, includes light-transmitting regions 341, light-blocking regions 342, and a semi-transmitting region 343. The fourth photomask 340 is positioned such that the light-blocking regions 341 correspond to regions in which the source and drain electrodes 191 and 192, respectively (see FIG. 1), are to be formed, and that the semi-transmitting region 343 corresponds to a region in which the transparent electrode 181 (see FIG. 1) is to be formed.

Figure 21:
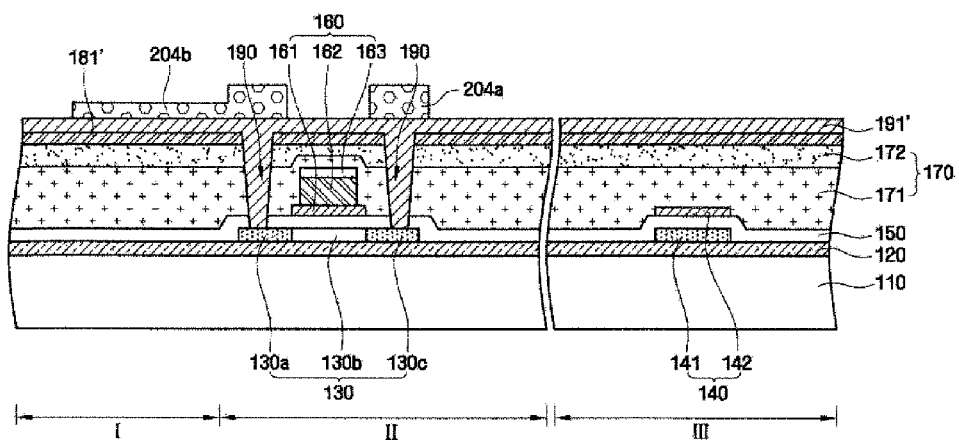

Referring to FIG. 21, the fourth photosensitive film 204 is exposed to light through the fourth photomask 340, and is then developed. As a result, regions of the fourth photosensitive film 204 which correspond to the light-transmitting regions 341 are removed, whereas regions of the fourth photosensitive film 204 which correspond to the light-blocking regions 342 and the semi-transmitting region 343 remain, so as to form a fourth photosensitive film pattern. The fourth photosensitive film pattern includes third sub photosensitive film patterns 204a corresponding to the light-blocking regions 342 and a fourth sub photosensitive film pattern 204b corresponding to the semi-transmitting region 343. The fourth sub photosensitive film pattern 204b is thinner than the third sub photosensitive film patterns 204a.

Figure 22:
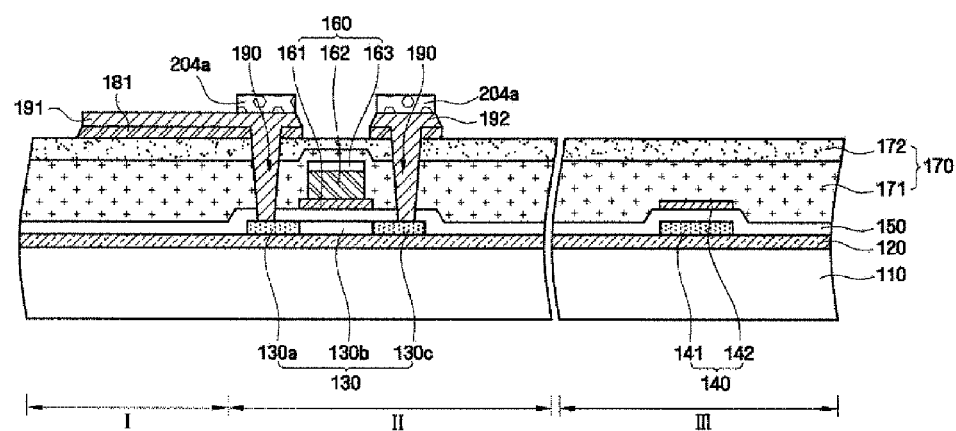

Referring to FIGS. 21 and 22, the conductive film 181' for the transparent electrode 181 and the conductive film 191' for the source and drain electrodes 191 and 192, respectively, are etched using the fourth photosensitive film pattern as an etch mask. In this regard, the conductive film 181' for the transparent electrode 181 and the conductive film 191' for the source and drain electrodes 191 and 192, respectively, may separately be wet-etched or dry-etched separately, or may be wet-etched simultaneously, using an etchant that contains nitric acid and fluorine ions. The conductive film 181' which remains after the etching process is formed into the transparent electrode 181.

Figure 23:
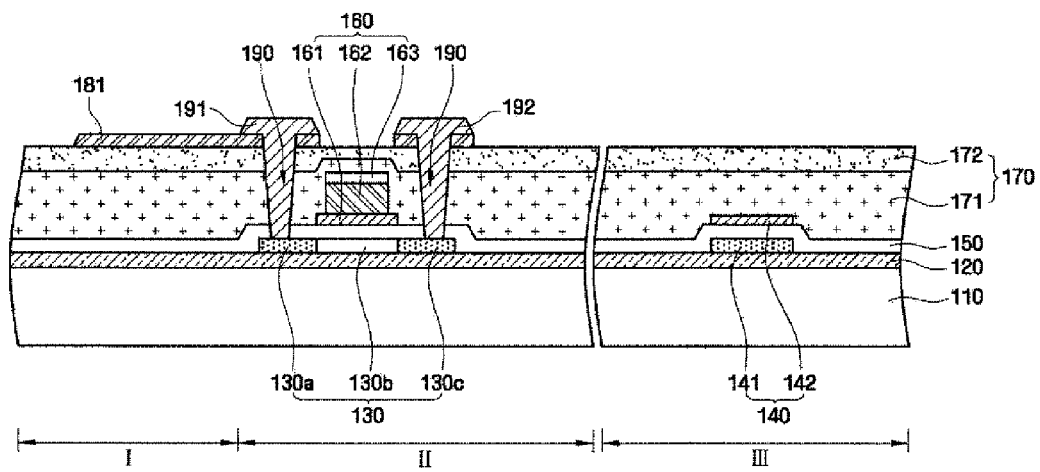

Referring to FIGS. 22 and 23, after the above etching process, the fourth sub photosensitive film pattern 204b is removed by, e.g., an ashing process using oxygen. When the fourth sub photosensitive film pattern 204b is removed, the third sub photosensitive film patterns 204a may also be partially removed. As a result, the thickness and width of the third sub photosensitive film patterns 204a may be reduced. The conductive film 191' for the source and drain electrodes 191 and 192, respectively, is etched again using the remaining third sub photosensitive film patterns 204a as etch masks. In this regard, the conductive film 191' for the source and drain electrodes 191 and 192, respectively, is removed from light-emitting region I, thereby exposing the transparent electrode 181 of the light-emitting region I. Any one (e.g., the source electrode 191) of the source and drain electrodes 191 and 192, respectively, is formed on the transparent electrode 181 of the transistor region II, and the other one (e.g., the drain electrode 192) of the source and drain electrodes 191 and 192, respectively, is formed on the conductive film 181' for the transparent electrode 181.

Figure 24:
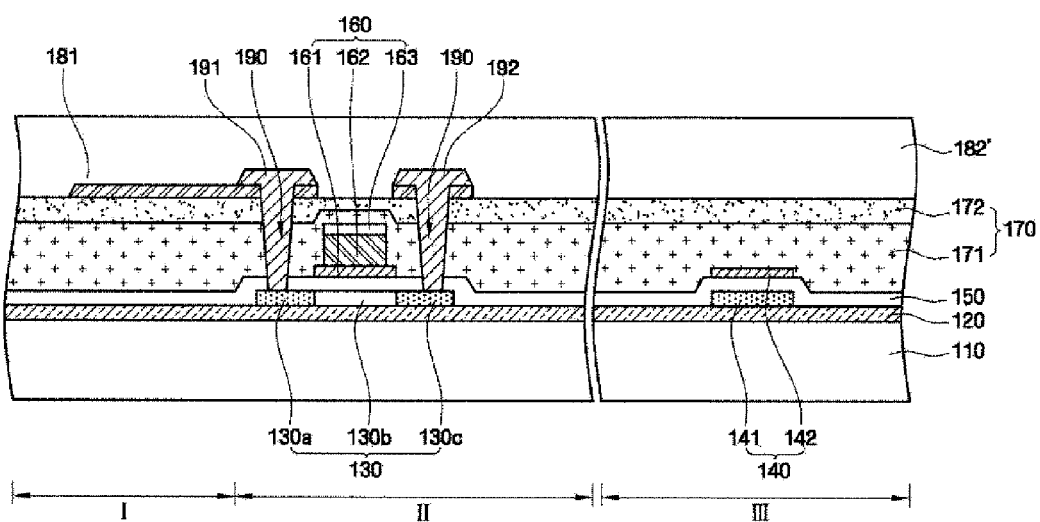
Figure 25:
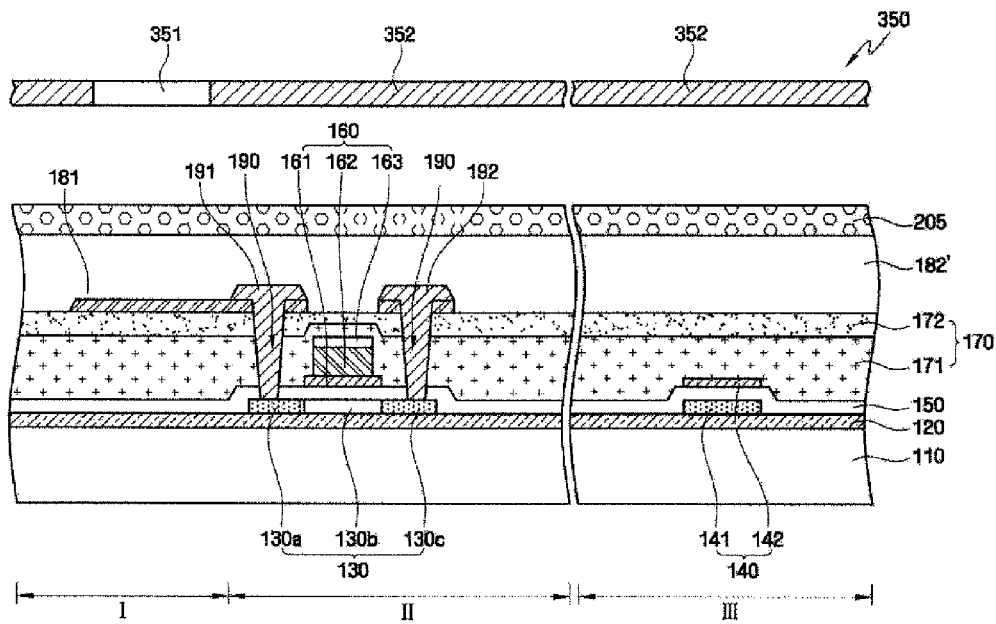
Figure 26:
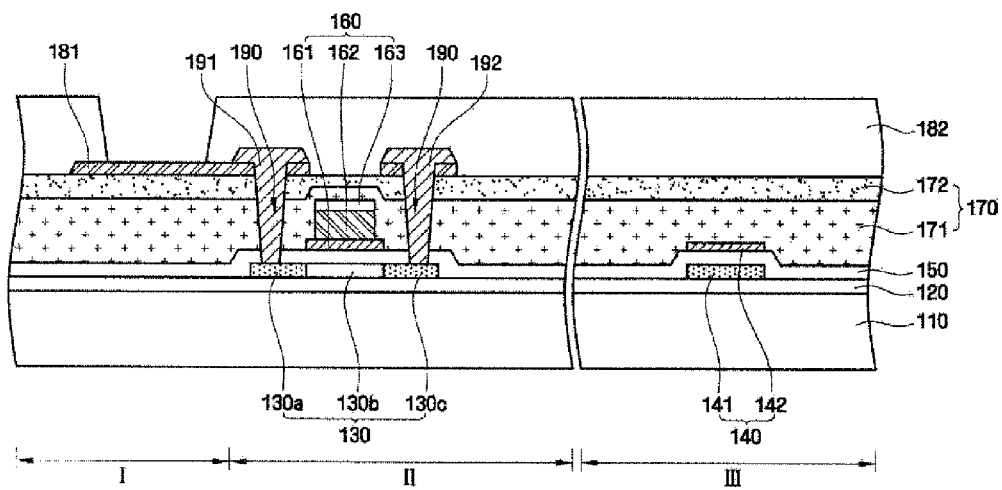

Referring to FIGS. 24 thru 26, an organic film 182' for forming a pixel defined layer 182 is stacked on the interlayer insulating film 170, the transparent electrode 181 and the source and drain electrodes 191 and 192, respectively, and is then patterned to form the pixel defined layer 182 which exposes the transparent electrode 181.

Referring to FIGS. 24 and 25, the organic film 182' for the pixel defined layer 182 is stacked on the source and drain electrodes 191 and 192, respectively, by, e.g., CVD, and a fifth photosensitive film 205 is formed on the organic film 182' for forming the pixel defined layer 182. A fifth photomask 350 is placed above the fifth photosensitive film 205. For ease of description, the case where the fifth photosensitive film 205 is a positive photosensitive film is described as an example. However, the present invention is not limited to this example, and a negative photosensitive film may also be used as the fifth photosensitive film 205.

The fifth photomask 350 includes a light-transmitting region 351 and light-blocking regions 352, and is positioned such that the light-transmitting region 351 corresponds to the transparent electrode 181. The fifth photosensitive film 205 is exposed to light through the fifth photomask 350, and is then developed. As a result, a region of the fifth photosensitive film 205 which corresponds to the light-transmitting region 351 is removed, whereas regions of the fifth photosensitive film 205 which correspond to the light-blocking regions 352 remain, so as to form a fifth photosensitive film pattern.

Referring to FIG. 26, the organic film 182' for the pixel defined layer 182 is etched using the fifth photosensitive film pattern as an etch mask, and then the fifth photosensitive film pattern is removed. In this regard, the organic film 182' for the pixel defined layer 182 may be dry-etched or wet-etched, and the fifth photosensitive film pattern may be removed by an ashing process. Through these processes, the pixel defined layer 182 exposing a predetermined region of the transparent electrode 181 is formed.

According to the current exemplary embodiment, an organic light-emitting display having the transparent electrode 181 formed on the interlayer insulating film 170 can be manufactured using five photomasks 310 thru 350. In the organic light-emitting display structured as described above, a resonance structure is formed between the substrate 110 and the transparent electrode 181. In addition, the interlayer insulating film 170 comprising multiple layers having different refractive indices improves the resonance efficiency without affecting device reliability. Furthermore, the gate electrode 160 is formed as a multilayer comprising the first gate electrode film 161, the second gate electrode 162 and the third gate electrode film 163, and the capacitor second electrode 142 is formed of the same material as the first gate electrode film 161 in the same process as the formation of the gate electrode 160.

Effects of the present invention will be described in further detail with reference to the following evaluation examples.

Evaluation Example 1

Color Reproducibility

An organic light-emitting display structured as shown in FIG. 4 (Embodiment 1), and an organic light-emitting display which is structured as shown in FIG. 4 but in which an interlayer insulating film is formed as a triple layer as shown in FIG. 2, were manufactured (Embodiment 2). In addition, an organic light-emitting display structured as shown in FIG. 3 was manufactured. In this organic light-emitting display, however, a transparent electrode is formed on a gate insulating film and is connected to source and drain electrodes by contact holes, and an interlayer insulating film is a single layer (Comparative example 1). An organic light-emitting display which is identical to the organic light-emitting display of Comparative example 1, but in which a buffer layer is a double layer, was also manufactured (Comparative example 2). The color reproducibility of the organic light-emitting displays manufactured as described above was measured, and the results are shown in Table 1 below.

TABLE 1

| | Embodiment 1 | Embodiment 2 | Comparative example 1 | Comparative example 2 |
|---|---|---|---|---|
| Interlayer insulating film | Double layer | Triple layer | — | — |
| Gate insulating film | Double layer | Double layer | Double layer | Double layer |
| Buffer layer | Double layer | Double layer | Single layer | Double layer |
| Color reproducibility (%) | 98.9 | 100.2 | 84 | 97.4 |

Referring to Table 1, since the transparent electrode is not formed on the interlayer insulating film in Comparative example 1 and Comparative example 2, the interlayer insulating film cannot form a resonance structure. While Embodiments 1 and 2 exhibit superior color reproducibility, Comparative example 1 exhibits poor color reproducibility. In the case of Comparative example 2, although the interlayer insulating film cannot form the resonance structure, good color reproducibility is obtained since the buffer layer and the gate insulating film have a multilayered structure.

Evaluation Example 2

Device Reliability

An organic light-emitting display (Embodiment 3), which is identical to that of Embodiment 2 but in which a gate insulating film is a single layer, was manufactured. Then, the threshold voltages of the organic light-emitting displays of Embodiments 1 thru 3 and of Comparative example 2 were measured under bias stress conditions, and the results are shown in FIG. 27.

Figure 27:
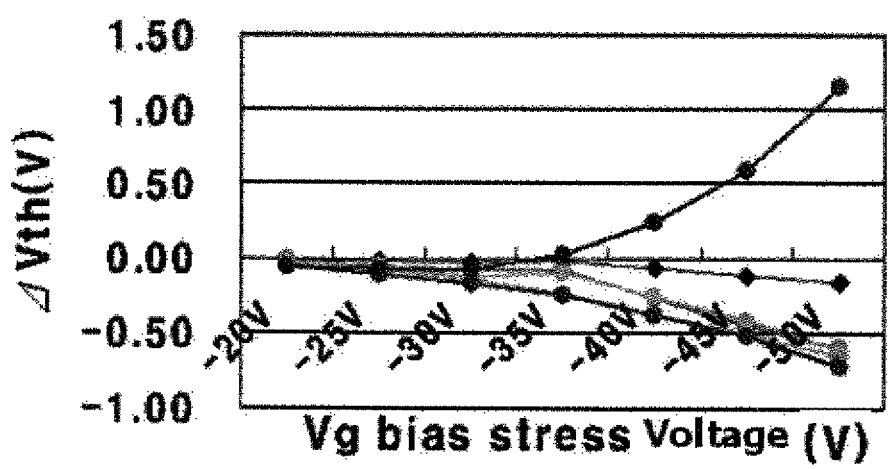
FIG. 27 is a graph illustrating the results of evaluating the device reliability of organic light-emitting displays manufactured according to embodiments of the present invention and comparative examples.

Referring to FIG. 27, the threshold voltages of the organic light-emitting displays of Embodiments 1 thru 3 hardly change, even under the bias stress conditions, thus ensuring device reliability. On the other hand, the threshold voltage of the organic light-emitting display of Comparative example 2 gradually increases. Such an increase in the threshold voltage adversely affects the operation of a device, thus reducing the reliability of the device.

It will be understood that device reliability is adversely affected when the gate insulating film or the buffer layer is formed as a multilayer in order to improve resonance efficiency.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only, and not for purposes of limitation.

What is claimed is:

1. An organic light-emitting display device, comprising:
   as gate electrode formed on a substrate;
   an interlayer insulating film formed on the substrate and covering the gate electrode, and comprising multiple layers having different refractive indices; and
   a transparent electrode formed on the interlayer insulating film;
   wherein the interlayer insulating film forms a resonance structure.

2. The organic light-emitting display device of claim 1, further comprising as gate insulating film formed under the gate electrode and on the substrate, wherein the gate insulating film comprises multiple layers having different refractive indices.

3. The organic light-emitting display device of claim 2, further comprising a buffer layer formed under the gate insulating film and on the substrate, wherein the buffer layer comprises multiple layers having different refractive indices.

4. The organic light-emitting display device of claim 1, further comprising an inorganic film formed between the substrate and the transparent electrode, wherein the inorganic film comprises multiple layers having different refractive indices.

5. The organic light-emitting display device of claim 1, further comprising, source and drain electrodes formed on the transparent electrode, wherein the transparent electrode is formed on the interlayer insulating film and in direct contact with the interlayer insulating film, and any one of the source and drain electrodes is formed on the transparent electrode and in direct contact with the transparent electrode.

6. The organic light emitting display device of claim 1, further comprising:
   an active layer formed between the gate electrode and the substrate, and comprising a source region and a drain region; and
   source and drain electrodes formed on the transparent electrode and connected to the source and drain regions, respectively, through contact holes formed in the transparent electrode.

7. The organic light emitting display device of claim 1, further comprising source and drain electrodes formed on top of the transparent electrode and connected to source and drain regions, respectively, through contact holes formed in the transparent electrode.

8. An organic light-emitting display device, comprising:
   a buffer layer formed on an entire surface of substrate;
   an active layer formed on the buffer layer and comprising a channel region and source and drain regions;
   a gate insulating film formed on the active layer;
   a gate electrode formed on the gate insulating film and overlapping the channel region;
   an interlayer insulating film formed on the gate insulating film and covering the gate electrode, and comprising multiple layers having different refractive indices; and
   a transparent electrode formed on the interlayer insulating film;
   wherein the interlayer insulating film forms a resonance structure.

9. The organic light-emitting display device of claim 8, further comprising source arid drain electrodes connected through contact holes to the source and drain regions, respectively, and formed on the transparent electrode.

10. The organic light-emitting display device of claim 9, wherein any one of the source and drain electrodes is formed on the transparent electrode and in direct contact with the transparent electrode.

11. The organic light-emitting display device of claim 8, wherein the buffer layer comprises multiple layers having different refractive indices.

12. The organic light-emitting display device of claim 8, wherein the gate insulating film comprises multiple layers having different refractive indices.

13. The organic light-emitting display device of claim 8, wherein the gate electrode has a multilayered structure comprising a first gate electrode film, a second gate electrode film and a third gate electrode film stacked sequentially.

14. The organic light-emitting display device of claim 13, further comprising a capacitive first electrode formed on the buffer layer, and as capacitive second electrode formed on the gate insulating film, wherein a thickness of the capacitive second electrode is equal to a thickness of the first gate electrode film.

15. The organic light-emitting display device of claim 13, wherein the first gate electrode film is narrower than the second gate electrode film and the third gate electrode film.

16. A method of manufacturing an organic light-emitting display device, the method comprising the steps of:
   forming a gate electrode, on a substrate;
   forming an interlayer insulating film on the substrate and covering the gate electrode, and comprising multiple layers having different refractive indices; and
   forming a transparent electrode on the interlayer insulating film;
   wherein the interlayer insulating film forms a resonance structure.

17. The method of claim 16, further comprising the steps of forming an active layer on the substrate and forming a buffer layer under the active layer by stacking multiple layers having different refractive indices.

18. The method of claim 17, further comprising the step of forming a gate insulating film on the substrate and the active layer by stacking multiple layers having different refractive indices.

19. A method of manufacturing an organic light-emitting display device, the method comprising the steps of:
   forming a buffer layer on an entire surface of a substrate;
   forming an active layer, which comprises a channel region and source and drain regions, on the buffer layer;

forming a gate insulating film on the active layer;
forming a gate electrode on the gate insulating film so as to overlap the channel region of the active layer;
forming an interlayer insulting film on the gate insulating film and covering the gate electrode, and comprising multiple layers having different refractive indices; and
forming a transparent electrode on the interlayer insulting film;
wherein the interlayer insulting film forms a resonance structure.

20. The method of claim 19, wherein the step of forming the gate insulating film comprises stacking multiple layers having different refractive indices.

21. The method of claim 19, wherein the step of forming the buffer layer comprises stacking multiple layers having different refractive indices.

22. The method of claim 19, wherein the step of forming the active layer comprises forming a capacitive first electrode as the active layer on the substrate, and wherein the step of forming the gate insulating film comprises forming a capacitive second electrode as the gate electrode on the gate insulating film.

23. The method of claim 22, wherein the step of forming the gate electrode and the capacitive second electrode comprises:
  forming a multilayered conductive film by sequentially stacking, a first conductive film, a second conductive film, and a third conductive film on the gate insulating film;
  forming a photosensitive film pattern, which comprises a first sub photosensitive film pattern corresponding to the gate electrode and a second sub photosensitive film pattern corresponding to the capacitive second electrode, on the third conductive film by using a halftone mask; and
  etching the first thin third conductive films using the photosensitive film pattern as an etch mask.

24. The method of claim 23, wherein the step of etching the first through third conductive films comprises:
  etching the first through third conductive films using the first sub photosensitive film pattern and the second sub photosensitive film pattern as etch masks, and then removing the second sub photosensitive film pattern; and
  etching the second conductive film and the third conductive film again using the remaining first sub photosensitive film pattern as an etch mask.

25. An organic light-emitting display device, comprising:
a buffer layer formed on an entire surface of a substrate;
an active layer formed on top of the buffer layer and comprising a channel region and source and drain regions;
a gate insulating film formed on top of the active layer;
a gate electrode formed on top of the gate insulating film and overlapping, the channel region, and having a multilayered structure including a gate electrode film;
an interlayer insulating film formed on top of the gate insulating film and covering the gate electrode;
a transparent electrode formed on top of the interlayer insulating film; and
a capacitive first electrode formed on top of the buffer layer, and a capacitive second electrode formed on top of the gate insulating film, wherein a thickness of the capacitive second electrode is equal to a thickness of the gate electrode film;
  wherein the gate electrode has a multilayered structure comprising a first gate electrode film, a second gate electrode film and a third gate electrode film stacked sequentially.

* * * * *